(12) United States Patent
Karlsson et al.

(10) Patent No.: US 8,854,026 B2
(45) Date of Patent: Oct. 7, 2014

(54) CAPACITANCE DETERMINATION IN A SWITCHED MODE POWER SUPPLY

(75) Inventors: Magnus Karlsson, Oskarshamn (SE); Torbjörn Holmberg, Kalmar (SE); Matz Lenells, Växsjö (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 390 days.

(21) Appl. No.: 13/380,245

(22) PCT Filed: Dec. 21, 2009

(86) PCT No.: PCT/EP2009/067633
§ 371 (c)(1),
(2), (4) Date: Dec. 22, 2011

(87) PCT Pub. No.: WO2010/149234
PCT Pub. Date: Dec. 29, 2010

(65) Prior Publication Data
US 2012/0098553 A1     Apr. 26, 2012

Related U.S. Application Data

(60) Provisional application No. 61/220,334, filed on Jun. 25, 2009.

(51) Int. Cl.
G05F 1/00       (2006.01)
G01R 27/26      (2006.01)
H02M 3/157      (2006.01)

(52) U.S. Cl.
CPC .......... *H02M 3/157* (2013.01); *G01R 27/2605* (2013.01)
USPC ......................................... 323/283; 324/684

(58) Field of Classification Search
CPC ... G01R 27/2605; H02M 3/156; H02M 3/157
USPC .......................................... 324/684; 323/283
See application file for complete search history.

(56) References Cited

U.S. PATENT DOCUMENTS 6,909,266 B2 *   6/2005   Kernahan et al. ............. 323/282
2002/0101251 A1  8/2002   Shimizu
(Continued)

FOREIGN PATENT DOCUMENTS

CN         1651924 A        8/2005

OTHER PUBLICATIONS

Zhenyu Zhao et al: "ESR Zero Estimation and Auto-compensation in Digitally Controlled Buck Converters" Applied Power Electronics Conference and Exposition, 2009, APEC 2009, Twenty-Fourth Annual IEEE, IEEE, Piscataway, NJ, USA Feb. 15, 2009, pp. 247-251 XP0314,42684 ISBN: 978-1-42414-2811-3 p. 247, figure 1.

*Primary Examiner* — Amy He

(57) ABSTRACT

A method of determining a measure of a total capacitance of one or more capacitive elements connected to an output of a switched mode power supply is described. The method includes generating a voltage control signal to cause an output voltage controller to sweep a voltage at the output of the switched mode power supply from an initial voltage value to a final voltage value. Sample values of a current at the output measured by a current sampler during the sweep of the output voltage are received, and an integrated current value representing a measure of the total capacitance using the received sample values is calculated.

17 Claims, 8 Drawing Sheets

(56) References Cited

U.S. PATENT DOCUMENTS

2002/0140438 A1 10/2002 Lund
2008/0169826 A1 7/2008 Bartling
2012/0182003 A1* 7/2012 Flaibani et al. ............... 323/284

* cited by examiner

CAPACITANCE DETERMINATION IN A SWITCHED MODE POWER SUPPLY

This application claims the benefit of U.S. Provisional Application No. 61/220,334, filed Jun. 25, 2009, the disclosure of which is fully incorporated herein by reference.

TECHNICAL FIELD

The present invention generally relates to the field of switched mode power supplies (sometimes referred to as switch mode power supplies or switching mode power supplies) and more specifically to the determination of a measure of the total capacitance of one or more capacitive elements connected to an output of a switched mode power supply.

BACKGROUND

The switched mode power supply (SMPS) is a well-known type of power converter having a diverse range of applications by virtue of its small size and weight and high efficiency, for example in personal computers and portable electronic devices such as cell phones. An SMPS achieves these advantages by switching a switching element such as a power MOSFET at a high frequency (usually tens to hundreds of kHz), with the frequency or duty cycle of the switching being adjusted using a feedback signal to convert an input voltage to a desired output voltage. An SMPS may take the form of a rectifier (AC/DC converter), a DC/DC converter, a frequency changer (AC/AC) or an inverter (DC/AC).

FIG. 1 is a simplified circuit diagram of a switched mode DC/DC power supply 10 in the form of a buck converter which converts an input voltage $V_{in}$ to a desired output voltage $V_{out}$, which is applied across a load represented by a resistor 20 connected in parallel with a load capacitor 30. The power supply 10 comprises an inductor 40, a filter capacitor 50, a diode 60, a power transistor 70 and a pulse-width modulating (PWM) controller 80, which controls the operation of the power supply. Although a single filter capacitor 50 is shown in the simplified diagram of FIG. 1, switched mode power supplies typically use large banks of capacitors for maintaining a stable output voltage during load transients or for keeping the voltage ripple at an acceptable level. The PWM controller applies voltage pulses 90 at an appropriate frequency (e.g. 300 kHz) to the gate of the power transistor 70. The PWM controller regulates the output voltage $V_{out}$ by adjusting the duty cycle D of the pulses (defined by $D=T_{ON}/T_{switch}$, where $T_{ON}$ is the duration of a pulse and $T_{switch}$ is the switch period) on the basis of a feedback signal generated by a differential amplifier 100. The feedback signal is indicative of the difference between the output voltage $V_{out}$ and the amplifier's reference voltage, $V_{Ref}$, which is controlled by the controller 80.

In order to optimise the performance of the feedback loop comprising the PWM controller 80, the system needs to be properly identified. A common method in system identification is to superimpose a disturbance on the normal signal and analyze what happens on the output, for example as described in "System Identification—Theory for the User" by L. Ljung (Prentice-Hall, Englewood Cliffs, ISBN 0-13-B81640, 1987). This disturbance can be injected in many different ways. One way is to use relay feedback, as described in "Automatic tuning of PID controllers" by K. J. Åström and T. Hagglund (Instrument Society of America, ISBN 1-55617-081-5, 1988). Alternatively, the disturbance can be injected by causing limit cycles or injecting a noise signal, as described in the doctoral thesis of Zhao Zhenyu, entitled "Design and Practical Implementation of Digital Auto-tuning and Fast-response Controllers for Low-power Switch-mode Power Supplies" (University of Toronto, Canada, 2008).

One critical problem with the above schemes is to control or limit the amplitude of the disturbance at the output. The loads of the SMPS sometimes have very strict requirements on overvoltage, which make this method inappropriate or even impossible to use. Furthermore in some applications, particularly those in the telecommunications industry, no disturbance at all on the output voltage can be tolerated. The aforementioned methods employing feedback control require complex calculations that take time and consume power. In addition, these methods place heavy demands on computational resources. Other methods which involve injecting sinusoidal disturbances and using cross-correlation in order to determine the system's transfer function are also time-consuming and require complex calculations that takes time and consume power, and require a lot of computation resources to be allocated.

It is therefore highly desirable to develop a scheme for optimising the feedback loop parameters in an SMPS that avoids the injection of any disturbance which can cause additional noise on the output voltage of the power supply. This requires a measure of the total capacitance coupled to the power supply's output to be established. This capacitance affects the system dynamics of the SMPS and must be considered during control law synthesis.

The development of new CMOS technologies in loads such as ASICs and FPGAs has led to tougher requirements on the power supply's current capabilities and voltage tolerance bands. Moreover, a bank of capacitors with a mix of different capacitor types is now often used for optimizing the electrical performance and cost of a particular load circuit. In addition, technical development has improved the electrical characteristics of the capacitors such that they have a higher capacitance and a lower equivalent series resistance (ESR). Thus the capacitive load can vary widely between different applications.

Accordingly, in situ identification of the capacitive load is of great interest for obtaining a good model of the system dynamics. Identification can also be used in combination with some autotuning algorithm which makes it possible to adjust for aging components and temperature drift in the real application, for example.

SUMMARY OF THE INVENTION

There is described in the following a fast and computationally efficient algorithm for load capacitance identification in an SMPS, in accordance with a preferred embodiment of the present invention. The algorithm allows the load capacitance to be determined accurately using modest hardware requirements and does not inject any disturbance in the control loop, thus ensuring that the output voltage is free from any perturbations. The accurate identification of the load capacitance can be used for tuning the control loop in the SMPS, yielding improved robustness and load transient response.

According to the present invention, a measure of a total capacitance of one or more capacitive elements connected to an output of a switched mode power supply is determined. A voltage control signal to cause an output voltage controller to sweep a voltage at the output of the switched mode power supply from an initial voltage value to a final voltage value is generated. Sample values of a current at the output measured by a current sampler during the sweep of the output voltage are received. An integrated current value representing a measure of the total capacitance using the received sample values is then calculated.

By calculating an integrated current value using current sample values measured during a sweep of the output voltage, for example at start-up of the SMPS, a measure of the total charge accumulated in the capacitive elements and hence of the total capacitance can be obtained. In an algorithm in accordance with an embodiment of the invention the integration is approximated with a sum of current samples. The algorithm is therefore computationally effective and suitable for implementation in hardware or software.

The present invention also provides a switched mode power supply controller for determining a measure of a total capacitance of one or more capacitive elements connected to an output of a switched mode power supply. The switched mode power supply controller includes a signal generator operable to generate a voltage control signal to cause an output voltage controller to sweep a voltage at the output of the switched mode power supply from an initial voltage value to a final voltage value. The controller also includes a receiver operable to receive sample values of a current at the output measured by a current sampler during the sweep of the output voltage, and a current calculator operable to calculate an integrated current value representing a measure of the total capacitance using the received sample values.

The present invention also provides a switched mode power supply comprising a switched mode power supply controller as set out above.

The present invention further provides a computer program product comprising a computer-readable storage medium or a signal carrying computer program instructions which, if executed by a programmable processor, cause the processor to perform a method as set out above.

BRIEF DESCRIPTION OF THE DRAWINGS

Embodiments of the invention will now be explained by way of example only, in detail, with reference to the accompanying figures, in which.

DETAILED DESCRIPTION OF EMBODIMENTS

Figure 1:
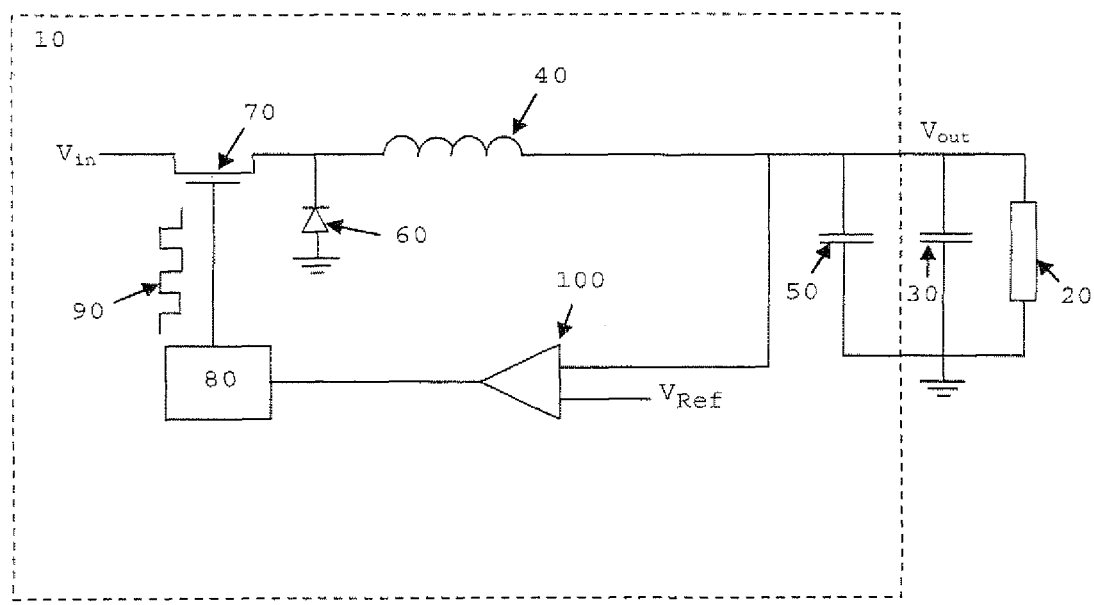
FIG. 1 is a schematic of a conventional switched mode DC/DC power supply connected to a load.
Figure 2:
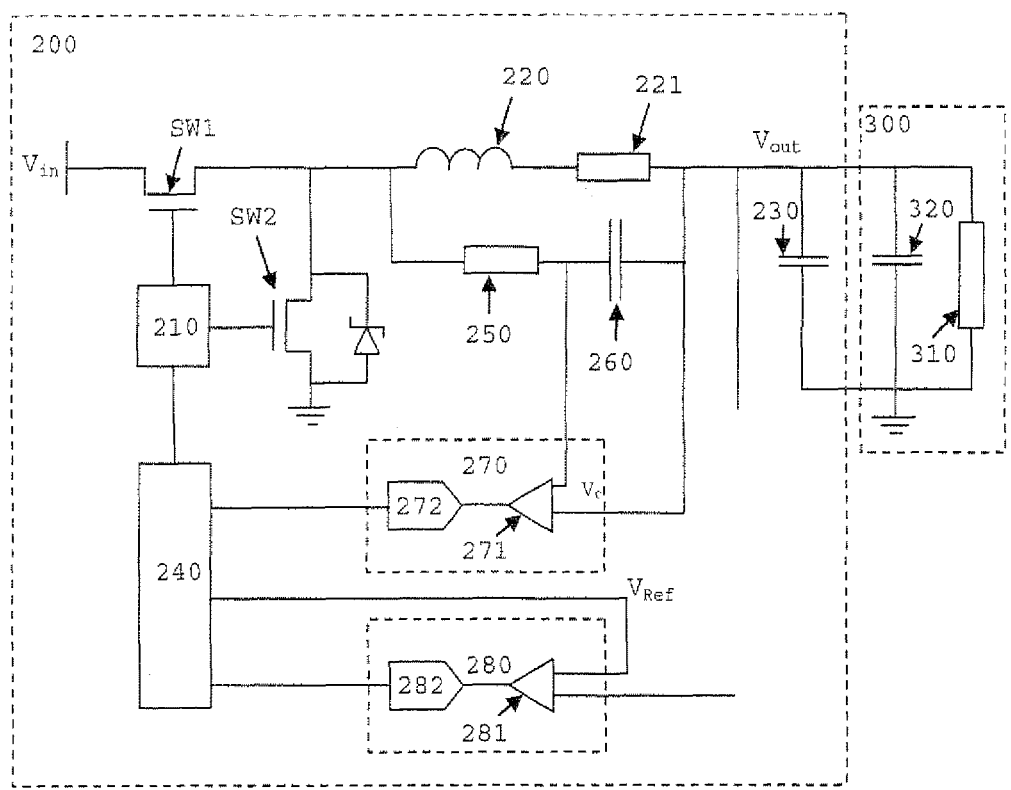
FIG. 2 illustrates a switched power supply according to an embodiment of the present invention.

FIG. 2 is a schematic of a switched mode DC/DC power supply 200 according to an embodiment of the present invention connected to a load 300. The load 300 comprises a resistive load represented by a resistor 310 of resistance $R_{load}$, and a capacitive element represented by a capacitor 320 of capacitance $C_{load}$. The resistive load and the capacitive element are connected in parallel between an output of the SMPS and a terminal held at a reference potential such as earth. The capacitive element may be a capacitor or any other electrical circuit component having a capacitance, for example a portion of a signal line electrostatically coupled to a grounded conductor. The capacitive element may be directly connected to the SMPS output and/or reference potential, or indirectly connected to the SMPS output and/or reference potential via one or more other capacitive elements or other electrical circuit components.

The power supply includes transistors SW1 and SW2 which are preferably power MOSFETs. The switching of transistors SW1 and SW2 is controlled by a PWM controller 210. The switching signals generated by the controller 210 may be transmitted directly to the gates of the transistors (as shown) or via respective switch driver circuits. The drain terminal of transistor SW1 is connected to a DC voltage line at $V_{in}$, while the source of transistor SW2 is connected to a reference point such as earth. The source of transistor SW1 and the drain of transistor SW2 are both connected to an output filter, which in this example comprises an inductor 220 of inductance L and intrinsic DC resistance (DCR) 221 of resistance $R_L$, and a capacitor 230 of capacitance $C_f$, which are connected as shown in FIG. 2.

The PWM controller 210 is configured to apply voltage pulses preferably at a frequency in the range between 20 kHz and 1 MHz to the gates of transistors SW1 and SW2, and to vary the duty cycle of the switching in response to a control signal received from an SMPS controller 240. Alternatively, instead of the PWM controller 210 a frequency-modulating controller (not shown) can be used, which modulates the frequency at which pulses of a fixed duration are generated. In either case the controller 210 or frequency modulating controller functions as an output voltage controller to control the output voltage of the SMPS.

In the circuit of FIG. 2, the current in the inductor 220 in the output filter is measured in order to obtain an estimate of the capacitance at the supply's output. The current in the inductor 220 may be measured using a resistive current shunt in series with the inductor. However, this degrades the power efficiency of the converter. It is therefore preferable to use a lossless method which exploits the inevitable parasitic resistance in the inductor, such as that described in "A Simple Current-Sense Technique Eliminating a Sense Resistor" (Linfinity Application Note AN-7, Rev. 1.1, 07/1998). The voltage over the DCR resistance $R_L$ is superimposed with a large square wave. This square wave can be removed with an RC circuit, comprising a resistor 250 of resistance R in series with a capacitor 260 of capacitance C, which is connected in parallel with the inductor as shown in FIG. 2.

The voltage drop $V_C$ across the capacitor 260 can be expressed as a function of the inductor current i as follows:

$$V_C(s) = R_L \frac{(1+sL/R_L)}{1+sCR} i(s) = R_T(s)i(s), \qquad \text{Eqn. 1}$$

where $R_T(s)$ is defined as the equivalent transimpedance and s is frequency. By setting the two time constants to be equal, i.e. $L/R_L=CR$, a pole/zero cancellation is obtained, yielding:

$$V_C(s)=R_L i(s) \qquad \text{Eqn. 2}$$

Hence, the transimpedance $R_T(s)=R_L$ becomes purely resistive and independent of frequency, allowing i to be determined simply. It is noted that the above-described R-C net used for the current measurement is only a preferred current measurement set-up, and that other arrangements can be used. For example, the resistance of switch transistor SW2 when it is turned ON may alternatively be measured.

The power supply 200 includes a current sampler 270 for obtaining sample values of a current flowing in the SMPS which are derived from measurements of a voltage (here, the voltage difference $V_C$), for input to the SMPS controller 240. The current measurements can be utilized in the normal operation of the SMPS for over-current protection and current feedback control, as well as for the capacitance determination described below.

In the present embodiment, the current sampler 270 comprises a differential amplifier 271 for amplifying the voltage difference $V_C$ and an ADC 272 for digitizing the signal input thereto by the differential amplifier 271. Since the inputs of the differential amplifier have the (potentially high) output voltage $V_{out}$ as reference, it is preferable that the differential amplifier has a high common mode rejection ratio (CMRR).

The ADC 272 is configured to digitize the signal input thereto to generate signals each representative of a sample value of the current flowing in the inductor at a different time. The ADC is preferably configured to sample at the SMPS switch frequency, $1/T_{switch}$, and to obtain for each switch period an output current sample value corresponding to the mean output current in the switch period. The maximum current during normal operation can be modelled as:

$$I_{normal} = I_{DCmax} + \frac{I_{ripple-pk-pk}}{2} + I_{headroom}, \quad \text{Eqn. 3}$$

where $I_{DCmax}$ is the maximum current that the SMPS should continuously deliver, $I_{headroom}$ gives headroom for current transients, e.g. $I_{headroom}=50\%$ of $I_{DCmax}$, and $I_{ripple-pk-pk}$ is the ripple current component. Sometimes inrush current $I_{start}$ during a ramp up of the output voltage of the SMPS can be larger than $I_{normal}$. In order to avoid saturation, the ADC 272 should be designed for the following maximum current:

$$I_{max} = \max\{I_{normal}, I_{start}\} \quad \text{Eqn. 4}$$

The ADC introduces a quantization noise which will increase the uncertainty of the current measurement. If the ADC has N bits and we assume a symmetric input range $\{-I_{max}, I_{max}\}$, the quantization step becomes:

$$Q_{ADC} = \frac{2I_{max}}{2^N} = \frac{I_{max}}{2^{N-1}} \quad \text{Eqn. 5}$$

The quantization error e(n) is uniformly distributed white noise with the maximum error of $\pm Q_{ADC}/2$. The noise variance is given by:

$$\text{Var}\{e(n)\} = \sigma_Q^2 = \frac{I_{max}^2}{12(2^{2N-2})} \quad \text{Eqn. 6}$$

The ADC 272 may sample continuously at a predetermined frequency, or in accordance with control signals received from a sampler control signal generator in the SMPS controller 240, which may instruct the ADC to sample in bursts of a specified start timing and duration. For example, the current sampler may measure and output current sample values, in accordance with the received control signals, only when the output voltage $V_{out}$ is being swept, for example during start-up of the SMPS. Signals representing the measured current values are fed from the sampler 270 to the SMPS controller 240 connected thereto.

The power supply 200 of the present embodiment also includes a voltage feedback signal generator 280 comprising a differential amplifier 281. One input terminal of the differential amplifier 281 is connected to the output line of the SMPS 200 while the amplifier's other input terminal is provided with a reference signal ($V_{Ref}$) by the SMPS controller 240. The error signal output by the differential amplifier 281 is sampled by an ADC 282 and the resulting digitised feedback signal is fed to the SMPS controller 240, which can use the signal for voltage feedback control and preferably also over-voltage protection.

The differential amplifiers 271 and 281, and ADCs 272 and 282 can readily be implemented by those skilled in the art in hardware in a form that meets the requirements of a particular SMPS, such that a further detailed description of these components and other related design criteria is unnecessary.

Figure 3:
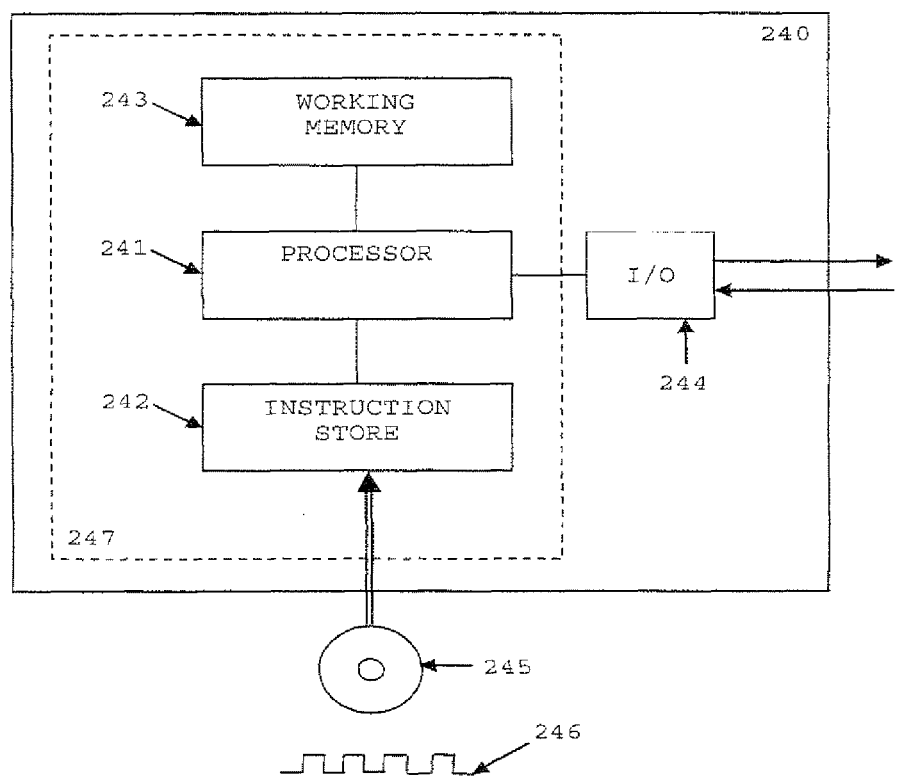
FIG. 3 shows the components of the signal processing unit shown in FIG. 2.

FIG. 3 shows the configuration of the SMPS controller 240 of the present embodiment. In this embodiment the SMPS controller 240 comprises a processor 241 and an instruction store 242 storing computer-readable instructions which, when executed by the processor 241 cause the processor 241 to perform the processing operations described herein below to calculate an integrated current value which provides a measure of the total charge on the capacitive elements connected to the output of the SMPS 200, hence of their total capacitance, $C_{total}=C_f+C_{load}$. The processor may, as in the present embodiment, further calculate the value of the total capacitance $C_{total}$ and preferably also of the load capacitance, $C_{load}$. Any of these values can be used by SMPS controller 240 for tuning the feedback loop. In the present embodiment the controller 240 is a PID controller, which generates control signals for the PWM controller 210 on the basis of the voltage feedback signal output by the signal generator 280, to thereby control the power supply's output voltage. Controller 240 may alternatively generate control signals to control the power supply's output current on the basis of the signal transmitted by the current sampler 270. Furthermore, although the controller 240 is a PID controller in the present embodiment, it may be a different type of controller in an alternative embodiment, such as a PI, PD or state space controller, for example.

The instruction store 242 may comprise a ROM which is pre-loaded with the computer-readable instructions. Alternatively, the instruction store 242 may comprise a RAM or similar type of memory, and the computer readable instructions can be input thereto from a computer program product, such as a computer-readable storage medium 245 such as a CD-ROM, etc. or a computer-readable signal 246 carrying the computer-readable instructions.

The SMPS controller 240 further comprises a working memory 243 for storing input current samples values and data during computation. The SMPS controller 240 also includes an input/output section 244 for receiving measured current values and for outputting voltage control signals.

Although the PWM controller 210, SMPS controller 240, differential amplifiers 271 and 281, and ADCs 272 and 282 are shown in FIG. 2 as separate components, one or more of these may be implemented in a single unit such as an integrated circuit (IC). For example, the SMPS controller 240 may comprise the controller 210, and optionally one of both of the current sampler 270 and the voltage feedback signal generator 280. The SMPS controller can be manufactured and sold separately from the remaining components of the switched mode power supply.

In the present embodiment the processor 241, instruction store 242 and working memory 243 together function as a signal generator operable to generate a voltage control signal to cause the output voltage controller 210 to sweep a voltage at the output of the switched mode power supply from an initial voltage value to a final voltage value; a receiver operable to receive sample values of a current at the output measured by the current sampler 270 during the sweep of the output voltage; and a current calculator operable to calculate an integrated current value representing a measure of the total capacitance using the received sample values.

In the present embodiment the processor 241, instruction store 242 and working memory 243 also together provide the function of a sampler control signal generator and a parameter setting section whose operation is described below.

However, before describing the operations performed by the SMPS controller 240 in the present embodiment, it is worthwhile to review some background which is helpful for understanding the present invention.

The capacitance C in a capacitor is given by:

$$C = \frac{Q}{V} \qquad \text{Eqn. 7}$$

where Q is the charge on the capacitor and V is the voltage drop across the capacitor. The charge in the capacitor can also be expressed as an integral of the current flowing into the capacitor:

$$Q = \int i(t)dt \qquad \text{Eqn. 8}$$

By integrating the current i(t) during a sweep of the voltage V from zero up to a final value $V_{final}$ the capacitance can be estimated as:

$$C = \frac{Q}{V_{final}} = \frac{\int i(t)dt}{V_{final}} \qquad \text{Eqn. 9}$$

The result of Eqn. 9 is employed in an algorithm in accordance with an embodiment of the present invention to determine a measure of the total capacitance $C_{total}$ in the circuit of FIG. 2, in circumstances where the current drawn by the resistive load (310) is negligible in comparison with that charging the capacitive elements (230 and 320) connected to the output of the SMPS, for example during a sweep of the output voltage from an initial value substantially equal to zero to a final value $V_{final}$ during start-up of the SMPS. It is assumed in the following description that the approximation $R_{load} \to \infty$ applies during the measurements of the output current that are used in the calculations described below.

The voltage sweep may increase or decrease the output voltage from an initial value. For example, the voltage sweep may increase the output voltage from a voltage value substantially equal to zero. Furthermore, the sweep may monotonically increase or decrease the output voltage $V_{out}$ of the SMPS in a linear or non-linear manner. However, where the output voltage sweep is linear increase or decrease (in other words, a linear ramp or simply a ramp) the current measured by the current sampler 270 is essentially constant, thus allowing its integration to be performed with high computational efficiency, as will now be explained.

Firstly, the calculation of the mean value of the current i in each switch cycle during a ramp up of the output voltage from an initial value of zero to a final value $V_{final}$ will be considered.

Assuming that the capacitance is constant, Eqn. 7 can be differentiated with respect to the time, yielding:

$$\frac{dQ}{dt} = C_{total}\frac{dV}{dt} \qquad \text{Eqn. 10}$$

By differentiating Eqn. 8 we obtain:

$$\frac{dQ}{dt} = i(t) \qquad \text{Eqn. 11}$$

Combining Equations 10 and 11, the following relation is obtained:

$$i(t) = C_{total}\frac{dV}{dt} \qquad \text{Eqn. 12}$$

The voltage gradient during the ramp up is equal to:

$$\frac{dV}{dt} = \frac{V_{final} - 0}{T_{ramp}} = \frac{V_{final}}{T_{ramp}} \qquad \text{Eqn. 13}$$

where $T_{ramp}$ is the duration of the ramp. Hence the mean current i(t) during the linear ramp is equal to the constant $$i(t) = \frac{C_{total}V_{final}}{T_{ramp}} = I_{start} \qquad \text{Eqn. 14}$$

Figure 4:
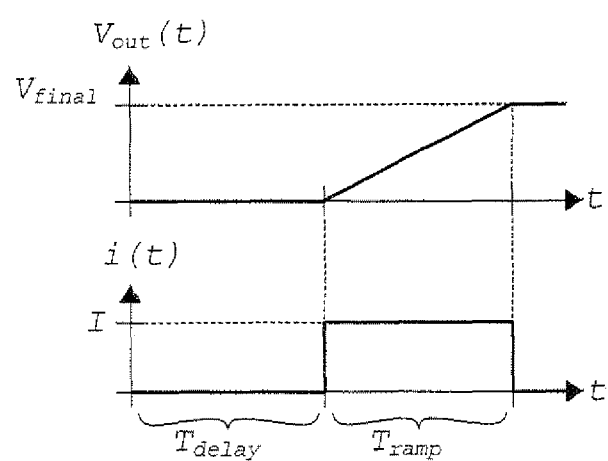
FIG. 4 shows schematic plots of the SMPS output voltage and current during a voltage ramp.

The variations of the output voltage and current as a function of time before and during a ramp of the output voltage are illustrated in FIG. 4.

The maximum peak current during the ramp up, $I_{start-max}$, which includes half the ripple current $I_{ripple-pk-pk}$ that is superimposed on the mean value i(t), can be written as:

$$I_{start-max} = \frac{\max\{C_{total}\} \cdot \max\{V_{final}\}}{\min\{T_{ramp}\}} + \frac{I_{ripple-pk-pk}}{2} \qquad \text{Eqn. 15}$$

$$= \frac{C_{max}V_{max}}{T_{min}} + \frac{I_{ripple-pk-pk}}{2}$$

where $C_{max}$ is the maximum total capacitance, $V_{max}$ is the maximum output voltage, and $T_{min}$ is the minimum ramp up time.

Since the ADC 272 measures samples of the current signal i(t) the integral in Eqn. 9 has to be approximated using a numerical integration technique. A common approach to approximating the function i(t) is to use a polynomial and the current samples i(n) as values of i(t). In the present example, where the output voltage sweep is linear, it is preferable to use the rectangle rule (also known as the midpoint rule), which uses a zero-order polynomial and is described as:

$$\int_a^b f(x)dx = (b-a)f\left(\frac{a+b}{2}\right) \qquad \text{Eqn. 16}$$

Using the samples i(n) as the midpoint values the following approximation of the integral around each sample is obtained:

$$\int_{-T_s/2}^{T_s/2} i(t)dt = T_s i(n) \quad \text{Eqn. 17}$$

where $T_s$ is the sample period. The total capacitance can be estimated by simply summing the current sample values measured during the ramp, and multiplying the result by the weighting factor $T_s/V_{final}$, as follows:

$$C_{total} = \frac{\int i(t)dt}{V_{final}} \quad \text{Eqn. 18}$$

$$\approx \frac{1}{V_{final}} \sum_{n=1}^{T_{ramp}/T_s} T_s i(n)$$

$$= \frac{T_s}{V_{final}} \sum_{n=1}^{T_{ramp}/T_s} i(n)$$

Thus where the output voltage sweep is linear in time the total capacitance $C_{total}$ can be determined using a simple and computationally efficient algorithm. The computation of the weighting factor involves a division, which can be pre-computed by the processor 241 and stored in the working memory 243 or can be computed before the ramp starts, or even during the ramp.

Alternatively, higher order approximation polynomials of the function i(t) can be used, such as the trapezoidal approximation or Simpson's rule. Although such approximations may allow the capacitance to be estimated more accurately in cases where the sweep is non-linear, they are unnecessary in the present example due to the shape of the current wave form illustrated in FIG. 4 and, moreover, are undesirable as they would increase the complexity of the algorithm. Additionally, the uncertainty in the value of $C_{total}$ can be reduced to a satisfactory level by taking a sufficiently large number of samples.

If $C_{filter}$ is known a priori, the load capacitance can then be estimated as:

$$C_{load} = C_{total} - C_{filter} \quad \text{Eqn. 19}$$

Figure 5:
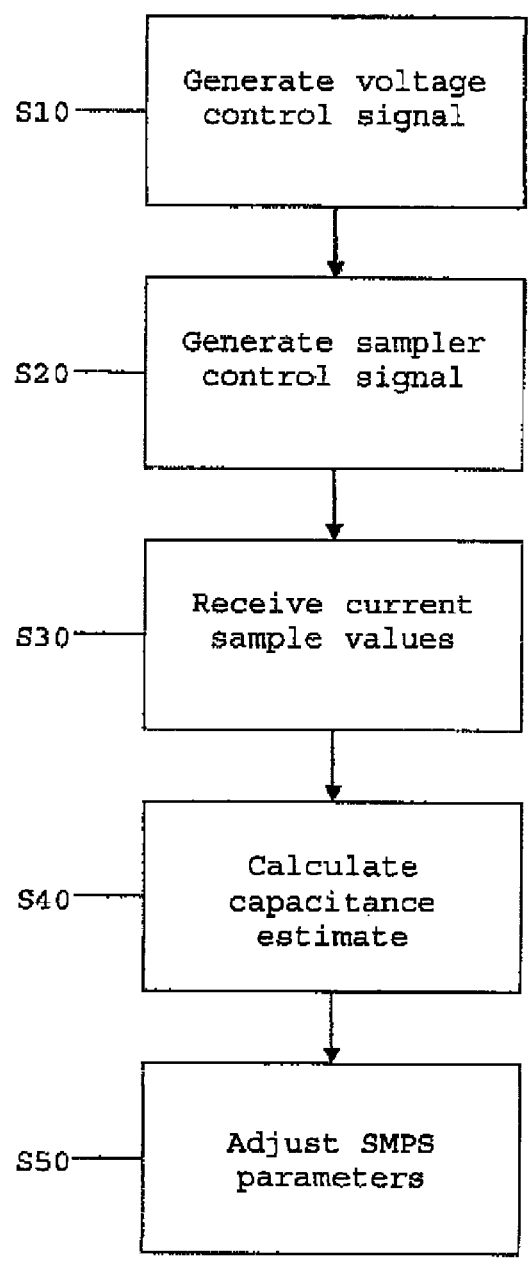
FIG. 5 shows a method of determining the total capacitive load on a SMPS in accordance with the embodiment.

The operation of the SMPS controller 240 in the present embodiment to acquire sample values of the output current and calculate using these values an integrated current value and values for $C_{total}$ and $C_{load}$ will now be described with reference to FIG. 5.

In step S10, at start-up of the SMPS 200 the processor 241 and instruction store 242 of the SMPS controller 240, together functioning as a signal generator, generate a voltage control signal for controlling the operation of the PWM controller 210. On the basis of the control signal, the PWM controller 210 ramps (i.e. increases in a linear manner) the output voltage $V_{out}$ of the SMPS from an initial value, which is substantially equal to zero in the present embodiment, to a final value, $V_{final}$. The output voltage ramp is effected by increasing the duty cycle of each successive voltage pulse applied to the gates of transistors SW1 and SW2. Although it is advantageous for the output voltage sweep to be linear as explained above, a non-linear sweep can be employed in an alternative embodiment.

In step S20, the processor 241 and instruction store 242, which together constitute a sampler control signal generator, generate a sampler control signal and transmit this signal to the current sampler 270. In the present embodiment the sampler starts to sample the output current at the beginning of the ramp and stops acquiring samples at the end of the ramp. Thus $T_{ramp}/T_s$ sample values (where $T_s = T_{switch}$ in the present embodiment) are measured by the current sampler 270, each sample value corresponding to the mean output current in a corresponding switch period of the SMPS.

In step S30, the sample values acquired by the current sampler are transmitted to the SMPS controller 240. The current sample values are received by the SMPS controller via the I/O section 244 and stored in the working memory 243.

In step 540, the processor 241, instruction store 242 and working memory 243, together functioning as a current calculator, firstly calculate an integrated current value by summing the received current sample values and then calculate an estimate of the total capacitance value $C_{total}$ using the weighting factor $T_s/V_{final}$, in accordance with the result in Eqn. 18. The load capacitance $C_{load}$ is thereafter calculated using Eqn. 19.

Finally, in step S50, the processor 241, instruction store 242 and working memory 243 function as a parameter setting unit to set one or more parameters of the SMPS 200 in dependence upon the calculated value for $C_{total}$ or $C_{load}$. For example, the identified total capacitance $C_{total}$ can be used together with the inductance value L of the inductor 220 to calculate the system's resonant frequency, $\omega_0 = 1/\sqrt{(LC_{total})}$. Where the SMPS controller 240 functions as a PID regulator, as in the present embodiment, it should, for optimal performance, have its control parameters set so to have the maximum phase lead near the system's resonance frequency $\omega_0$ (see, e.g. "Fundamentals of Power Electronics" by R. W. Erikson and D. Maksimovic, Kluwer Academic Publishers, $2^{nd}$ Ed. 2001, Section 9.5 entitled "Regulator Design"). However, the SMPS controller 240 need not be a PID regulator and may alternatively employ state-space feedback control, PD-control, Lead-Lag compensation etc. Parameters that could be adjusted are the phase lead frequency in a Lead-Lag compensator, or the natural frequency of the zeros in a PID controller. Furthermore, the estimated capacitance value can be used for changing the current limit during a subsequent voltage ramp, for example a ramp up during a subsequent start-up of the power supply.

Although the sequence of steps S10 to S50 is performed at start-up of the SMPS 200 in the present embodiment, it may be performed additionally or alternatively one or more times during the subsequent operation of the SMPS. Thus, in alternative embodiments the output voltage may be swept from an initial value different to zero. However, in these cases the approximation that during the voltage sweep the current charging the capacitive elements connected to the output of the SMPS greatly exceeds that through the resistive load $R_{load}$, should also apply.

The uncertainty of the capacitance estimate obtained in the above-described embodiment can be analyzed by analyzing the variance of the capacitance estimate. With the ADC quantization noise e(n) being taken into account, Eqn. 18 becomes:

$$C_{total} = \frac{T_2}{V_{final}} \sum_{n=1}^{T_{ramp}/T_s} [i(n) + e(n)] \quad \text{Eqn. 20}$$

The variance of $C_{total}$ in Eqn. 20 is given by:

$$\text{Var}\{C_{total}\} = \text{Var}\left\{\frac{T_s}{V_{final}} \sum_{n=1}^{T_{ramp}/T_s} [i(n)+e(n)]\right\} \quad \text{Eqn. 21}$$

$$= \text{Var}\left\{\frac{T_s}{V_{final}} \sum_{n=1}^{T_{ramp}/T_s} e(n)\right\}$$

$$= \left(\frac{T_s}{V_{final}}\right)^2 \text{Var}\left\{\sum_{n=1}^{T_{ramp}/T_s} e(n)\right\} =$$

$$= \left(\frac{T_s}{V_{final}}\right)^2 \text{Var}\left\{\sum_{n=1}^{T_{ramp}/T_s} e(n)\right\}$$

$$= \left(\frac{T_s}{V_{final}}\right)^2 \frac{T_{ramp}}{T_s} \text{Var}\{e(n)\}$$

$$= \frac{T_s T_{ramp} \sigma_Q^2}{V_{final}^2}$$

Here, it is assumed that the noise e(n) is uncorrelated. The variance of the capacitance estimate will decrease with decreasing sample period $T_s$, decreasing ramp time and and increasing output voltage $V_{final}$. The maximum variance of the capacitance estimate $\sigma_C^2$ is given by:

$$\text{Var}_{max}\{C_{total}\} = \sigma_C^2 = \frac{T_s T_{ramp-max} \sigma_Q^2}{V_{min}^2} \quad \text{Eqn. 22}$$

where $T_{ramp-max}$ is the maximum ramp up time, and $V_{min}$ the minimum final output voltage.

The uncertainty in the capacitance estimate can be designed by choosing the resolution in the current ADC 272. By combining Eqn. 6 and Eqn. 22 and solving for N, the following result is obtained:

$$N = \frac{1}{2} \log_2\left(\frac{T_s T_{ramp-max} I_{max}^2}{12 \sigma_C^2 V_{min}^2}\right) + 1 \quad \text{Eqn. 23}$$

Figure 6:
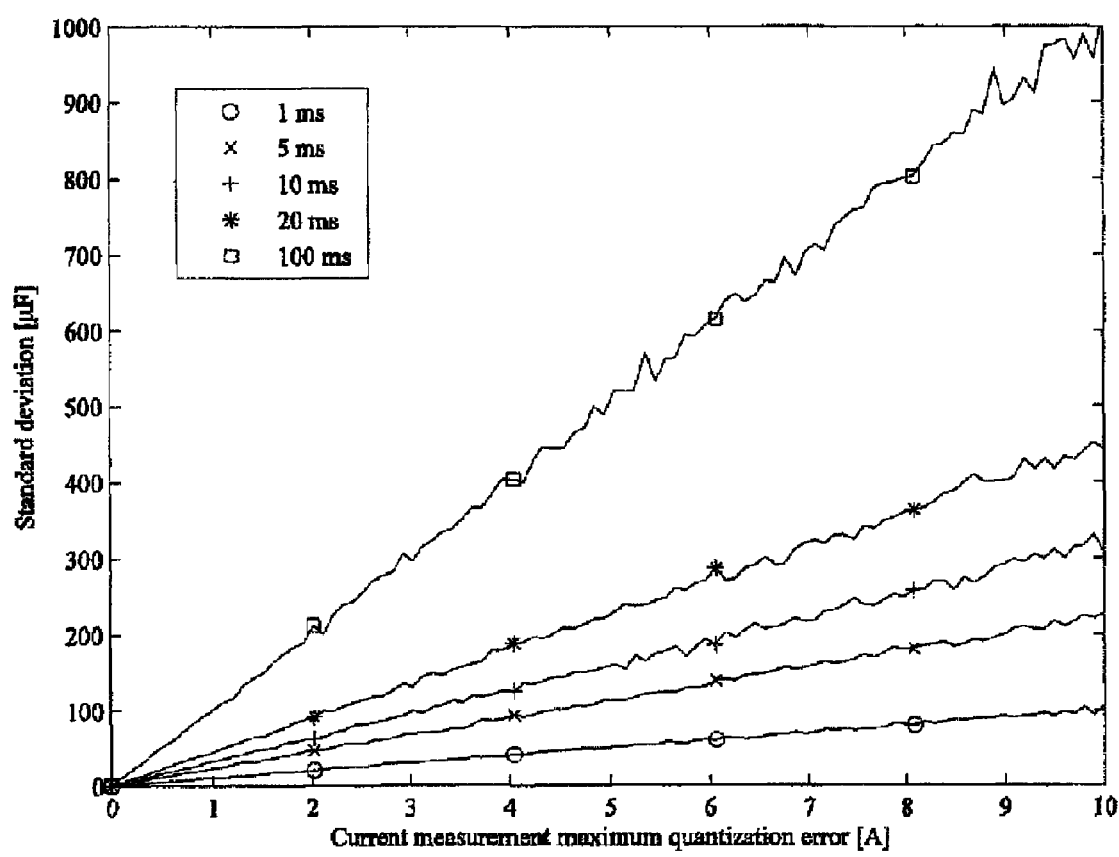
FIG. 6 shows the capacitance estimate uncertainty as a function of the maximum quantisation error in the current ADC for various values of the ramp time.

FIG. 6 shows the results of simulations of how the standard deviation in the capacitance estimate varies with the current measurement maximum quantization error, for five different values of $T_{ramp}$. In this simulation the sample period $T_s$ is taken to be 3.33 µs, the output voltage $V_{final}$=3.3 V, and a total capacitance $C_{total}$=1 mF.

Figure 7:
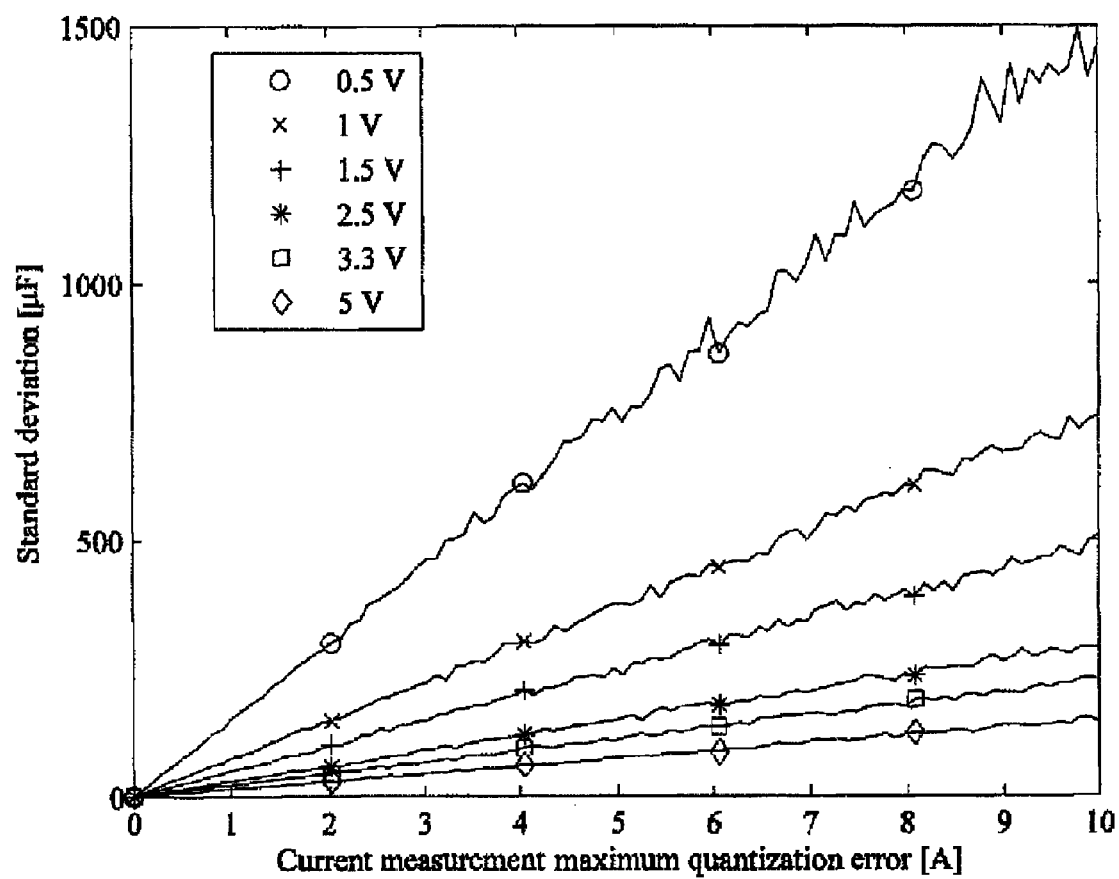
FIG. 7 shows the capacitance estimate uncertainty as a function of the maximum quantisation error in the current ADC for various values of the final output voltage.

FIG. 7 illustrates how the standard deviation of the capacitance estimate varies with the current measurement maximum quantization error, for six different values of the final output voltage $V_{final}$. In these simulations the ramp up time $T_{ramp}$ is taken to be 5 ms.

The method of the above-described embodiment has the advantage of being able to provide an accurate estimate of the total capacitance with modest hardware requirements, as will now be explained with reference to a design example.

The design example employs a power supply with $I_{DCmax}$=20 A and a final output voltage in the range $1 \leq V_{final} \leq 5$ V, switching at a switching frequency $f_s$=300 kHz. The ramp up time is configurable in the range $5 \leq T_{ramp} \leq 30$ ms. The ripple current is taken to be $I_{ripple-pk-pk}$=10 A, and current headroom $I_{headroom}$=50% of $I_{DCmax}$, i.e. 10 A. Equation 3 yields a normal operation maximum current of $$I_{normal} = I_{DCmax} + \frac{I_{ripple-pk-pk}}{2} + I_{headroom} = 35 A \quad \text{Eqn. 24}$$

The maximum inrush current during the ramp up is determined by Eqn. 15. Solving for the maximum total capacitance, the following result is obtained:

$$C_{max} = \frac{(I_{start-max} - I_{ripple-pk-pk}/2)T_{min}}{V_{max}} \quad \text{Eqn. 25}$$

Assuming that $I_{max}=I_{start-max}=I_{normal}$=35 A, the maximum output voltage is $V_{max}$=5 V, and that the minimum ramp up time is $T_{min}$=5 ms, a maximum total capacitance of $C_{max}$=30 mF is obtained.

Equation 23 can be used to determine the number of bits N required in the current ADC 272 for a given uncertainty in the capacitance estimate. For example, in order to obtain an uncertainty in the capacitance estimate of $\pm 3\sigma_C = \pm 300$ µF in the present example, the following value of N is required:

$$N = \frac{1}{2} \log_2\left(\frac{T_s T_{ramp-max} I_{max}^2}{12 \sigma_C^2 V_{min}^2}\right) + 1 \quad \text{Eqn. 26}$$

$$= \frac{1}{2} \log_2\left(\frac{3.33 \text{ µs} \cdot 30 \text{ ms} \cdot (30A)^2}{12 \cdot (100 \text{ µF})^2 \cdot (1 V)^2}\right) + 1$$

$$= 6$$

In the present example it is assumed that the current is sampled once per switch cycle, i.e. that $T_s = 1/f_s = 1/300$ kHz=3.33 µs. Hence, only N=6 bits are required to achieve the target level of accuracy, which is a very modest resolution.

[Modifications and Variations]

Many modifications and variations can be made to the embodiment described above. Examples of such modifications and variations, which may be made individually or in any combination, will now be described.

For example, in the embodiment described above, the SMPS controller 240 comprises a programmable processing apparatus which is arranged to perform, in accordance with software instructions stored in instruction store 242, the described processing operations of: generating the voltage control signals signal; receiving the current sample values; calculating the integrated current value; generating the sampler control signals; setting one or more SMPS parameters; and performing overall system management, and over-current and over-voltage protection. However, it will be appreciated that one or more of the aforementioned functions may be provided using different apparatus. For example, the SMPS controller 240 may comprise one or more non-programmable hardware modules (e.g. one or more ASICs) dedicated to performing the aforementioned functions. One or more such ASICS may be integrated into a single IC chip. Furthermore, each function may he provided by a physically separate apparatus, with the apparatus collectively constituting the SMPS controller 240.

Furthermore, although measurements of the output current are performed for the full duration of the voltage ramp ($T_{ramp}$) in the above embodiment, circumstances may arise in which an improved capacitance estimate can be obtained by modifying the method such that the output current is sampled only before or only after the output voltage has passed a threshold value which differs from the initial and final voltage values. For example, it may be that current leakage from the SMPS charges the capacitors at the SMPS output before the voltage ramp starts. The adverse effect of this leakage on the capacitance estimate can be mitigated by starting to sample above a certain voltage level, which is labelled $V_{start}$ in the schematic plot in FIG. 8A of the output voltage vs. time during a ramp. In this case, Eqn. 18 should be generalised to:

$$C_{total} = \frac{T_s}{V_{final} - V_{start}} \sum_n i(n) \qquad \text{Eqn. 27}$$

where the sum represents a sum of the current sample values measured in the voltage interval ($V_{start}$, $V_{final}$).

Figure 8A:
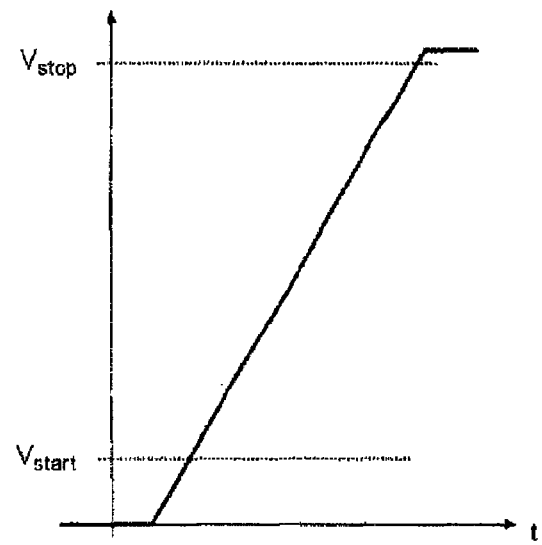
FIGS. 8A and 8B show examples of voltage intervals in which current sample values are measured during a voltage ramp.

Alternatively, a situation may arise where the SMPS is loaded with another SMPS which starts its own voltage ramp at a certain output voltage level of the first SMPS, which is labelled $V_{stop}$ in FIG. 8A. Since the second SMPS may draw significant current during its voltage ramp, errors in the capacitance estimate determined in the first SMPS (caused by the breakdown of the approximation that $R_{load}$ is large) can be avoided by ceasing to measure current sample values when the output voltage of the first SMPS reaches the voltage $V_{stop}$. In this case, Eqn. 18 should be generalised to:

$$C_{total} = \frac{T_s}{V_{stop}} \sum_n i(n) \qquad \text{Eqn. 28}$$

where the sum represents a sum of the current sample values measured in the voltage interval (0, $V_{stop}$).

Many other circumstances occur where it is advantageous for the current sampler 270 to sample the output current only before or only after the output voltage has passed a threshold value, in accordance with the sampler control signal. In such alternative embodiments the threshold value should be appropriately chosen so as to reduce the error in the calculated integrated current value.

Similarly, an improved capacitance estimate may be obtained by modifying the above embodiment such that the current sampler 270 is controlled by the sampler control signal to sample the current at the output only after the output voltage has passed a first threshold value ($V_{start}$ in FIG. 8A) and only before the output voltage has passed a second threshold value ($V_{stop}$ in FIG. 8A) different from the first threshold value, the first and second threshold values both being different from the initial and final values. In such alternative embodiments the first and second threshold values should be chosen so as to reduce the error in the calculated integrated current value. In this case, Eqn. 18 should be generalised to:

$$C_{total} = \frac{T_s}{V_{stop} - V_{start}} \sum_n i(n) \qquad \text{Eqn. 29}$$

where the sum represents a sum of the current sample values measured in the voltage interval ($V_{start}$, $V_{stop}$).

Figure 8B:
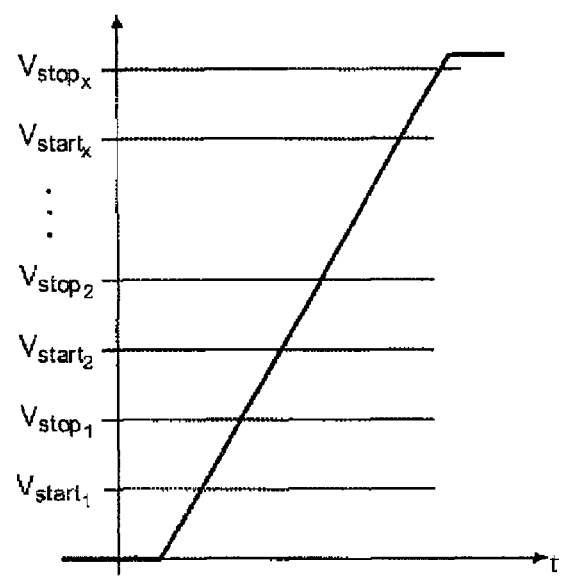

Furthermore, in a yet further alternative the current sampler 270 is controlled by the sampler control signal to take samples of the output current only in two or more separate voltage intervals within the output voltage range that is covered during the ramp. Examples of such voltage intervals are shown in FIG. 8B, which shows a plot of the output voltage vs. time during a ramp. The voltage intervals illustrated are ($V_{start1}$, $V_{stop1}$), ($V_{start2}$, $V_{stop2}$) . . . , ($V_{startx}$, $V_{stopx}$). In the case where there are k voltage intervals, Eqn. 18 can be generalised to:

$$C_{total} = \frac{T_s}{\sum_k (V_{stop_k} - V_{start_k})} \sum_k \sum_n i(n) \qquad \text{Eqn. 30}$$

Since the voltage intervals in each of Eqns. 27-30 can be predetermined, the weighting factors in these eauations can still be pre-calculated by the processor 241 and stored in the working memory 243 or can be computed before the ramp starts, or even during the ramp.

Furthermore, although in the above-described embodiment the current sampler 270 samples the output current during a time or voltage interval whose end points are determined by the sampler control signal generated by the SMPS controller 240, in an alternative embodiment the current sampler may sample continuously, in an autonomous manner. Thus step S20 in FIG. 5 may be omitted. In this case, after receiving the current sample values acquired by the sampler, the current calculator selects from the received values a subset of the sample values comprising current values measured only during the voltage sweep and uses this subset of values in its calculations of the capacitance values. To improve the accuracy of the capacitance estimate, the current calculator preferably processes the received sample values to select therefrom a subset of the sample values comprising current values measured only before or only after the output voltage has passed a threshold value different from the initial and final values. As with the modification described above with reference to FIG. 8A, the threshold value should be selected so as to reduce the error in the calculated integrated current value.

In a further embodiment, for better accuracy the current calculator is configured to process the received sample values to select therefrom a subset of the sample values comprising current values measured only after the output voltage has passed a first threshold value and only before the output voltage has passed a second threshold value different from the first threshold value, the first and second threshold values both being different from the initial and final values. The first and second threshold values should be such as to reduce the error in the calculated integrated current value.

The invention claimed is:

1. A method of determining a measure of a total capacitance of one or more capacitive elements connected to an output of a switched mode power supply, comprising:

generating a voltage control signal to cause an output voltage controller to sweep a voltage ($V_{out}$) at the output of the switched mode power supply from an initial voltage value to a final voltage value;

generating a sampler control signal to control a current sampler to sample a current at the output only before or only after the output voltage has passed a threshold value ($V_{start}$, $V_{stop}$) different from the initial and final values;

receiving sample values of the current at the output measured by the current sampler during the sweep of the output voltage; and calculating an integrated current value representing a measure of the total capacitance using the received sample values, the threshold value being such as to reduce an error in the calculated integrated current value.

2. A method of determining a measure of a total capacitance of one or more capacitive elements connected to an output of a switched mode power supply, comprising:
generating a voltage control signal to cause an output voltage controller to sweep a voltage ($V_{out}$) at the output of the switched mode power supply from an initial voltage value to a final voltage value;
generating a sampler control signal to control a current sampler to sample a current at the output only after the output voltage has passed a first threshold value ($V_{start}$) and only before the output voltage has passed a second threshold value ($V_{stop}$) different from the first threshold value, the first and second threshold values both being different from the initial and final values;
receiving sample values of the current at the output measured by the current sampler during the sweep of the output voltage; and
calculating an integrated current value representing a measure of the total capacitance using the received sample values, the first and second threshold values being such as to reduce an error in the calculated integrated current value.

3. A method of determining a measure of a total capacitance of one or more capacitive elements connected to an output of a switched mode power supply, comprising:
generating a voltage control signal to cause an output voltage controller to sweep a voltage ($V_{out}$) at the output of the switched mode power supply from an initial voltage value to a final voltage value;
receiving sample values of a current at the output measured by a current sampler during the sweep of the output voltage;
processing the received sample values to select therefrom a subset of the sample values comprising current values measured only before or only after the output voltage has passed a threshold value ($V_{start}$, $V_{stop}$) different from the initial and final values; and
calculating an integrated current value representing a measure of the total capacitance using the received sample values, the threshold value being such as to reduce an error in the calculated integrated current value, wherein the integrated current value is calculated using the selected subset of sample values.

4. A method of determining a measure of a total capacitance of one or more capacitive elements connected to an output of a switched mode power supply, comprising:
generating a voltage control signal to cause an output voltage controller to sweep a voltage ($V_{out}$) at the output of the switched mode power supply from an initial voltage value to a final voltage value;
receiving sample values of a current at the output measured by a current sampler during the sweep of the output voltage;
processing the received sample values to select therefrom a subset of the sample values comprising current values measured only after the output voltage has passed a first threshold value ($V_{start}$) and only before the output voltage has passed a second threshold value ($V_{stop}$) different from the first threshold value, the first and second threshold values both being different from the initial and final values; and
calculating an integrated current value representing a measure of the total capacitance using the received sample values, the first and second threshold values being such as to reduce an error in the calculated integrated current value, wherein the integrated current value is calculated using the selected subset of sample values.

5. The method according claim 4, wherein the process of generating a voltage control signal comprises generating a voltage control signal to cause the output voltage controller to ramp the voltage ($V_{out}$) at the output of the switched mode power supply from the initial voltage value to the final voltage value.

6. The method according to claim 4, wherein the process of generating a voltage control signal comprises generating a voltage control signal to sweep the output voltage ($V_{out}$) from an initial voltage value substantially equal to zero.

7. The method according to claim 4, wherein the switched mode power supply comprises an output filter having a capacitor, and the method further comprises:
weighting the integrated current value with a weighting factor to give a weighted value;
calculating a load capacitance value by subtracting a capacitance value of said capacitor from the weighted value; and
setting at least one parameter of the switched mode power supply in dependence upon the calculated load capacitance value.

8. The method according to claim 4, wherein each sample value used to calculate the integrated current value corresponds to the output current averaged over a switch period of the switched mode power supply.

9. A switched mode power supply controller for determining a measure of a total capacitance of one or more capacitive elements connected to an output of a switched mode power supply, comprising:
a signal generator operable to generate a voltage control signal for causing an output voltage controller to sweep a voltage ($V_{out}$) at the output of the switched mode power supply from an initial voltage value to a final voltage value;
a sampler control signal generator operable to generate a sampler control signal to control a current sampler to sample a current at the output only before or only after the output voltage has passed a threshold value ($V_{start}$, $V_{stop}$) different from the initial and final values;
a receiver operable to receive sample values of the current at the output measured by the current sampler during the sweep of the output voltage ($V_{out}$); and
a current calculator operable to calculate an integrated current value representing a measure of the total capacitance using the received sample values, the threshold value being such as to reduce an error in the calculated integrated current value.

10. A switched mode power supply controller for determining a measure of a total capacitance of one or more capacitive elements connected to an output of a switched mode power supply, comprising:
a signal generator operable to generate a voltage control signal for causing an output voltage controller to sweep a voltage ($V_{out}$) at the output of the switched mode power supply from an initial voltage value to a final voltage value;
a sampler control signal generator operable to generate a sampler control signal to control a current sampler to sample a current at the output only after the output voltage has passed a first threshold value ($V_{start}$) and only before the output voltage has passed a second threshold value ($V_{stop}$) different from the first threshold value, the first and second threshold values both being different from the initial and final values;

a receiver operable to receive sample values of the current at the output measured by the current sampler during the sweep of the output voltage ($V_{out}$); and a current calculator operable to calculate an integrated current value representing a measure of the total capacitance using the received sample values, the first and second threshold values being such as to reduce an error in the calculated integrated current value.

11. A switched mode power supply controller for determining a measure of a total capacitance of one or more capacitive elements connected to an output of a switched mode power supply, comprising:

a signal generator operable to generate a voltage control signal for causing an output voltage controller to sweep a voltage ($V_{out}$) at the output of the switched mode power supply from an initial voltage value to a final voltage value;

a receiver operable to receive sample values of a current at the output measured by a current sampler during the sweep of the output voltage ($V_{out}$); and a current calculator operable to calculate an integrated current value representing a measure of the total capacitance using the received sample values, wherein the current calculator is further operable to process the received sample values to select therefrom a subset of the sample values comprising current values measured only before or only after the output voltage has passed a threshold value ($V_{start}$, $V_{stop}$) different from the initial and final values, the threshold value being such as to reduce an error in the calculated integrated current value, wherein the integrated current value is calculated using the selected subset of sample values.

12. A switched mode power supply controller for determining a measure of a total capacitance of one or more capacitive elements connected to an output of a switched mode power supply, comprising:

a signal generator operable to generate a voltage control signal for causing an output voltage controller to sweep a voltage ($V_{out}$) at the output of the switched mode power supply from an initial voltage value to a final voltage value;

a receiver operable to receive sample values of a current at the output measured by a current sampler during the sweep of the output voltage ($V_{out}$); and a current calculator operable to calculate an integrated current value representing a measure of the total capacitance using the received sample values, wherein the current calculator is further operable to process the received sample values to select therefrom a subset of the sample values comprising current values measured only after the output voltage has passed a first threshold value ($V_{start}$) and only before the output voltage has passed a second threshold value ($V_{stop}$) different from the first threshold value, the first and second threshold values both being different from the initial and final values and being such as to reduce an error in the calculated integrated current value, wherein the integrated current value is calculated using the selected subset of sample values.

13. The switched mode power supply controller according to claim 12, wherein the signal generator is operable to generate a voltage control signal for causing the output voltage controller to ramp the voltage ($V_{out}$) at the output of the switched mode power supply from the initial voltage value to the final voltage value.

14. The switched mode power supply controller according to claim 12, wherein the signal generator is operable to generate a voltage control signal to sweep the output voltage ($V_{out}$) from an initial voltage value substantially equal to zero.

15. The switched mode power supply controller according to claim 12, wherein the switched mode power supply comprises an output filter having a capacitor, and wherein the current calculator is further operable to:

weight the integrated current value with a weighting factor to give a weighted value; and calculate a load capacitance value by subtracting a capacitance value of said capacitor from the weighted value;

and wherein the switched mode power supply controller further comprises a parameter setting unit operable to set at least one parameter of the switched mode power supply in dependence upon the calculated load capacitance value.

16. The switched mode power supply controller according to claim 12, wherein each sample value used to calculate the integrated current value corresponds to the output current averaged over a switch period of the switched mode power supply.

17. The switched mode power supply comprising a switched mode power supply controller according to claim 9.

* * * * *